US005583749A

United States Patent [19]
Tredennick et al.

[11] Patent Number: 5,583,749
[45] Date of Patent: Dec. 10, 1996

[54] BASEBOARD AND DAUGHTERCARD APPARATUS FOR RECONFIGURABLE COMPUTING SYSTEMS

[75] Inventors: Harry L. Tredennick, Los Gatos, Calif.; David E. Van den Bout, Apex, N.C.

[73] Assignee: Altera Corporation, San Jose, Calif.

[21] Appl. No.: 348,280

[22] Filed: Nov. 30, 1994

[51] Int. Cl.⁶ .............................. H01R 23/68; H05K 1/11
[52] U.S. Cl. ..................... 361/790; 361/735; 361/733; 361/784; 361/785; 361/803; 439/44; 439/66
[58] Field of Search .................... 361/729–733, 361/735, 736, 739, 742, 784–787, 789, 790, 791, 807, 808, 809, 810, 803; 439/44–47, 49, 50, 54, 55, 60, 61, 65, 66, 68, 69, 74–76, 86, 90, 91, 928.1; 364/708.1

[56] References Cited

U.S. PATENT DOCUMENTS

| | | | |
|---|---|---|---|
| 5,130,894 | 7/1992 | Miller | 361/735 |
| 5,181,167 | 1/1993 | Davidson et al. | 361/735 |
| 5,537,295 | 7/1996 | Van Den Bout et al. | 361/767 |

FOREIGN PATENT DOCUMENTS

| | | | |
|---|---|---|---|
| 2130025 | 9/1983 | United Kingdom | H01R 9/09 |
| 2239565 | 11/1990 | United Kingdom | H01R 13/71 |

OTHER PUBLICATIONS

*Anyboard: An FPGA–Based Reconfigurable System*, by David E. Van den Bout, et al., IEEE Design & Test of Computers, Sep. 1992.

*The 1993 Anyboard Rapid–Prototyping Environment*, by Dr. David E. Van den Bout, et al., 4th Intl. Workshop on Rapid System Prototyping (IEEE), Jun. 28–30, 1993.

*The Anyboard: A Rapid–Prototyping System for Use In Teaching Digital Circuit Design*, by Thomas A. Petersen, et al., 1st Intl. Workshop on Rapid System Prototyping (IEEE), Jun. 4–7, 1990.

*IQ160 Field Programmable Interconnect Device*, I–Cube Design Systems, Inc.

*Product Announcement of X–12 Reconfigurable Logic System*, National Technologies, Inc., Jan. 14, 1994.

Product Literature, *Zycad Product News: Paradigm RP™ Rapid Prototyping System*, Zycad Corporation, Apr. 1994, 3 pp.

*Why The Paradigm RP™ Rapid Prototyping System Is A Better Choice*, Zycad Corporation, Apr. 1994, 5 pp.

IBM Technical Disclosure Bulletin, vol. 38, No 5, May 1995, "Stacked Memory Modules", pp. 433–434.

*Primary Examiner*—Donald A. Sparks
*Attorney, Agent, or Firm*—Townsend and Townsend and Crew LLP

[57] ABSTRACT

A reconfigurable apparatus for computing systems including a set of baseboards and a family of daughtercards, together with a programmable interface to an external bus for a host system. Daughtercards attach to the baseboard through complementary connectors mounted on the baseboard and the daughtercards. In addition, daughtercards are constructed to allow stacking of daughtercards vertically. The baseboard and daughtercard approach of the present invention allows simple, incremental upgrade of installed boards by adding or replacing the daughtercards and allows simple migration to new systems by changing baseboards.

25 Claims, 7 Drawing Sheets

BASEBOARD AND DAUGHTERCARD APPARATUS FOR RECONFIGURABLE COMPUTING SYSTEMS

BACKGROUND OF THE INVENTION

The present invention relates in general to circuit board apparatus used for implementing computing subsystems, and in particular to an apparatus including a baseboard and a family of reconfigurable daughtercards.

Printed circuit boards (PCBs) facilitate rapid construction of electronic circuits by providing a stable insulating sheet of material upon which circuit components are mounted. The components are typically interconnected using thin plated conductive (e.g. copper) lines bonded to the sheet that form circuit paths. A large variety of PCBs has been developed for many different applications.

Field programmable devices (FPDs) are circuits that include a large number of gates whose interconnection can be programmed to form a desired logic function. Utilizing any one of a variety of reprogrammable technologies, FPDs allow engineers to electrically program (and reprogram) standard, off-the-shelf logic elements to meet the specific needs of their application. Thus, FPDs combine the logistical advantages of standard, fixed integrated circuits with the architectural flexibility of custom devices. For the purposes of this description, the terminology "programmable device" refers to once programmable as well as reprogrammable devices.

Larger and more complex circuits can be developed by combining and interconnecting several FPDs on a PCB. A growing field of application for such boards is design and rapid implementation of prototypes for larger systems such as a microprocessor. Using computer aided design (CAD) tools and versatile FPD-based PCBs designers can develop, in a matter of hours, digital systems containing thousands of gates.

One example of an FPD-based PCB is the "Anyboard" developed at North Carolina State University. The Anyboard consists of a hardware card that incorporates six FPDs (more specifically field programmable gate arrays, or FPGAs), three random access memory (RAM) chips, buffers and local and global buses that connect the FPGAs to the RAMs and buffers. A complete description of the Anyboard system can be found in "Anyboard: An FPGA-based, reconfigurable system," IEEE Design & Test of Computers, pages 21–30, September 1992, by Van den Bout et al.

While FPD-based PCBs such as the Anyboard provide flexibility in terms of the variety of circuits that can be developed, to the extent that the architecture of the board is fixed in hardware the application of the board is limited. In case of the Anyboard, for example, the number of FPGAs and RAMs as well as the bus interconnection are fixed in hardware. This also limits the user's ability to upgrade and expand the system's hardware.

Altera Corporation of San Jose has developed a reconfigurable FPD-based universal circuit board (UCB) that provides significant improvements in terms of interconnect and architecture flexibility. The UCB includes a number of sockets that can receive FPDs, field programmable interconnect devices (FPIDs), or selective shorting circuits interchangeably. Various inter-socket interconnect topologies and board interface alternatives provide further flexibility. The UCB is fully described in a commonly assigned patent application, Ser. No. 08/206,774 filed Mar. 4, 1994 now U.S. Pat. No. 5,537,295, which is hereby incorporated by reference in its entirety.

While the UCB incorporates a sizable amount of memory on board, to add more memory or other types of logic blocks requires separate additional boards. This is also true if the application requires more than the maximum number of gates available on the UCB.

There is, therefore, a need for an improved circuit board apparatus that provides reconfigurability and increased flexibility in architecture, interconnectivity and ability to expand.

SUMMARY OF THE INVENTION

The present invention provides a rapid prototyping system that is made up of independent reconfigurable modules or daughtercards that are mounted on a baseboard or mothercard. Multiple daughtercards can be mounted on the baseboard in a planar or stacked fashion. The modular architecture allows for easy expansion and upgrade of the system.

Each reconfigurable daughtercard in the prototyping system of the present invention is designed as a system independent module that can carry any combination of field programmable devices, memory circuits or any other type of functional block. The baseboard is then especially designed to accommodate system dependent factors for each particular application.

Each reconfigurable daughtercard includes an internal bus network to interconnect its various components as well as a special input/output array of connectors. The daughtercard may be either single-sided or double-sided (i.e., carrying components on both sides of the card) for maximum use of space. Complementary arrays of connectors are provided on daughtercards and baseboards to allow a daughtercard to mount on a baseboard or to stack vertically on top of another daughtercard. The system hardware can therefore be easily expanded by adding more daughtercards as required.

Accordingly, the modular design of the prototyping system of the present invention allows simple, incremental upgrade of installed boards by adding to or replacing daughtercards, and allows simple migration to new systems by changing the baseboard.

A better understanding of the nature and advantages of the prototyping system of the present invention may be had with reference to the following drawings and detailed description.

DESCRIPTION OF SPECIFIC EMBODIMENTS

Figure 1A:
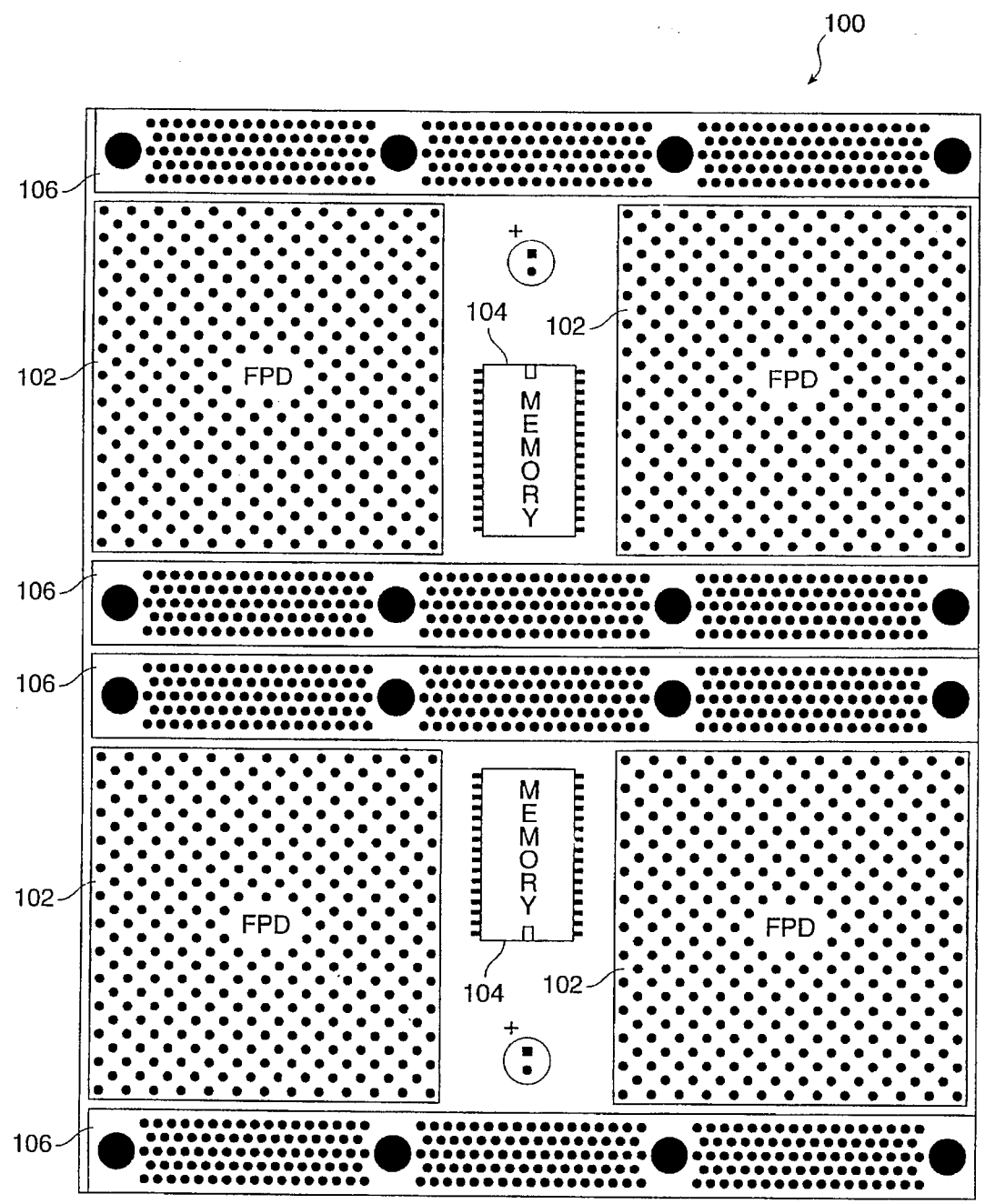
FIG. 1A illustrates one side of an exemplary daughtercard according to the present invention.
Figure 1B:
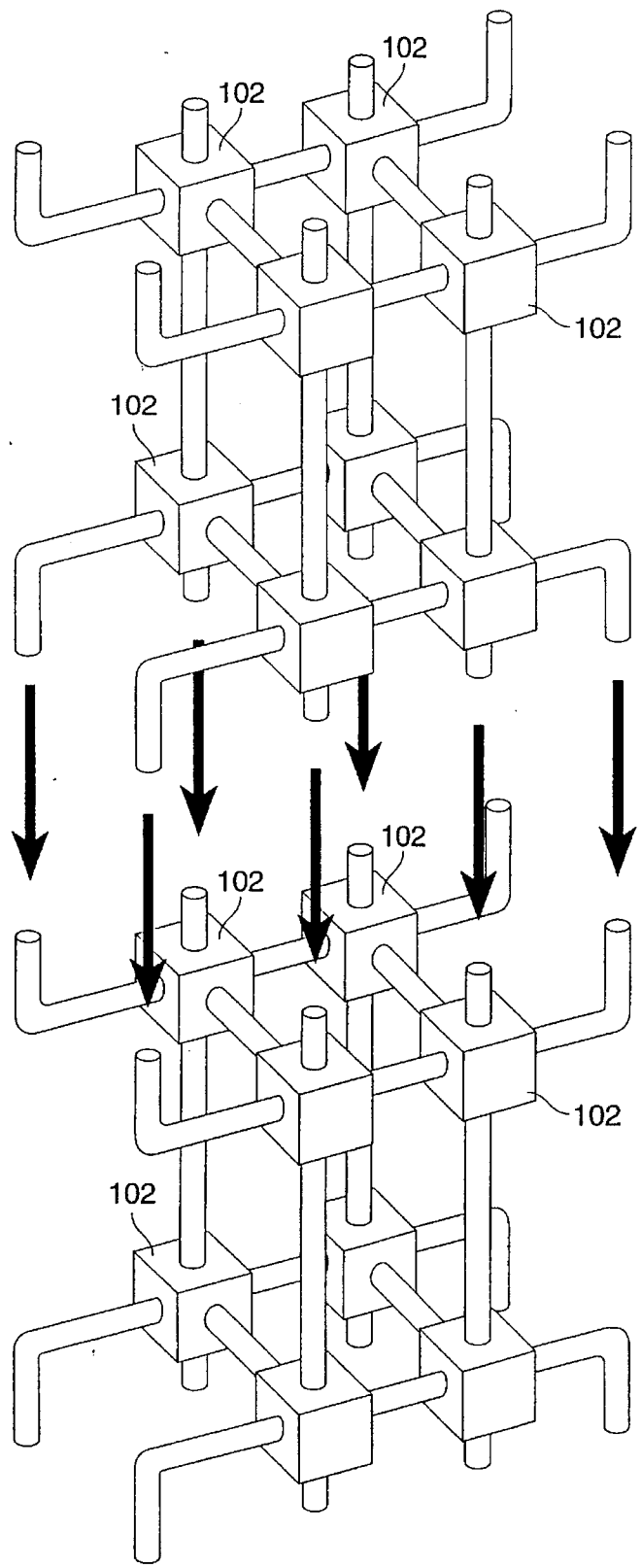
FIG. 1B shows a three dimensional view of an exemplary bussing arrangement within a daughtercard as well as between two stacked daughtercards.

Referring to FIG. 1, there is shown the top side of an exemplary daughtercard 100 for the prototyping system of the present invention. In this example, the top side of the daughtercard includes four field programmable devices (FPDs) 102, two memory devices 104, and four connector pad arrays 106. The bottom side is a mirror image of the top side, doubling the total count of the components. An alternative embodiment of the daughtercard may replace the central array of connector pads with more memory devices. However, the embodiment shown in FIG. 1 with higher I/O count may be preferable since in applications where larger memory is needed a dedicated memory daughtercard can easily be added to the system. Daughtercard 100 includes internal busing (not shown) that interconnects its various components. Each memory device 104 connects to two adjacent FPDs 102 in a manner similar to that described in application Ser. No. 08/206,774 filed Mar. 4, 1994 now U.S. Pat. No. 5,537,295, while FPDs 102 interconnect in a nearest-neighbor cube. As shown in the three dimensional diagram of FIG. 1B, the nearest-neighbor cube arrangement provides direct connection between each FPD 102 and its two adjacent neighbors as well as the FPD located directly under it. More complicated busing arrangements are made possible by stacking a special busing card above daughtercard 100. Such busing card may include wiring traces that connect pins from connector pad array 106 to reproduce various interconnect topologies, several examples of which are described in the above-cited application Ser. No. 08/206, 774.

The type of FPD 102 used depends on the application. High density FPDs such as Altera FLEX81500 provide higher input/output (I/O) pin count (a total of 313 I/O pins) and more capacity, while parts such as Altera FLEX81188 provide a lower cost alternative with fewer I/Os. Similarly, depending on the application, memory devices 104 can be either large (e.g., 512 K×8) synchronous random access memories (SRAMs), or any one of a variety of smaller and faster memory circuits.

Figure 2A:
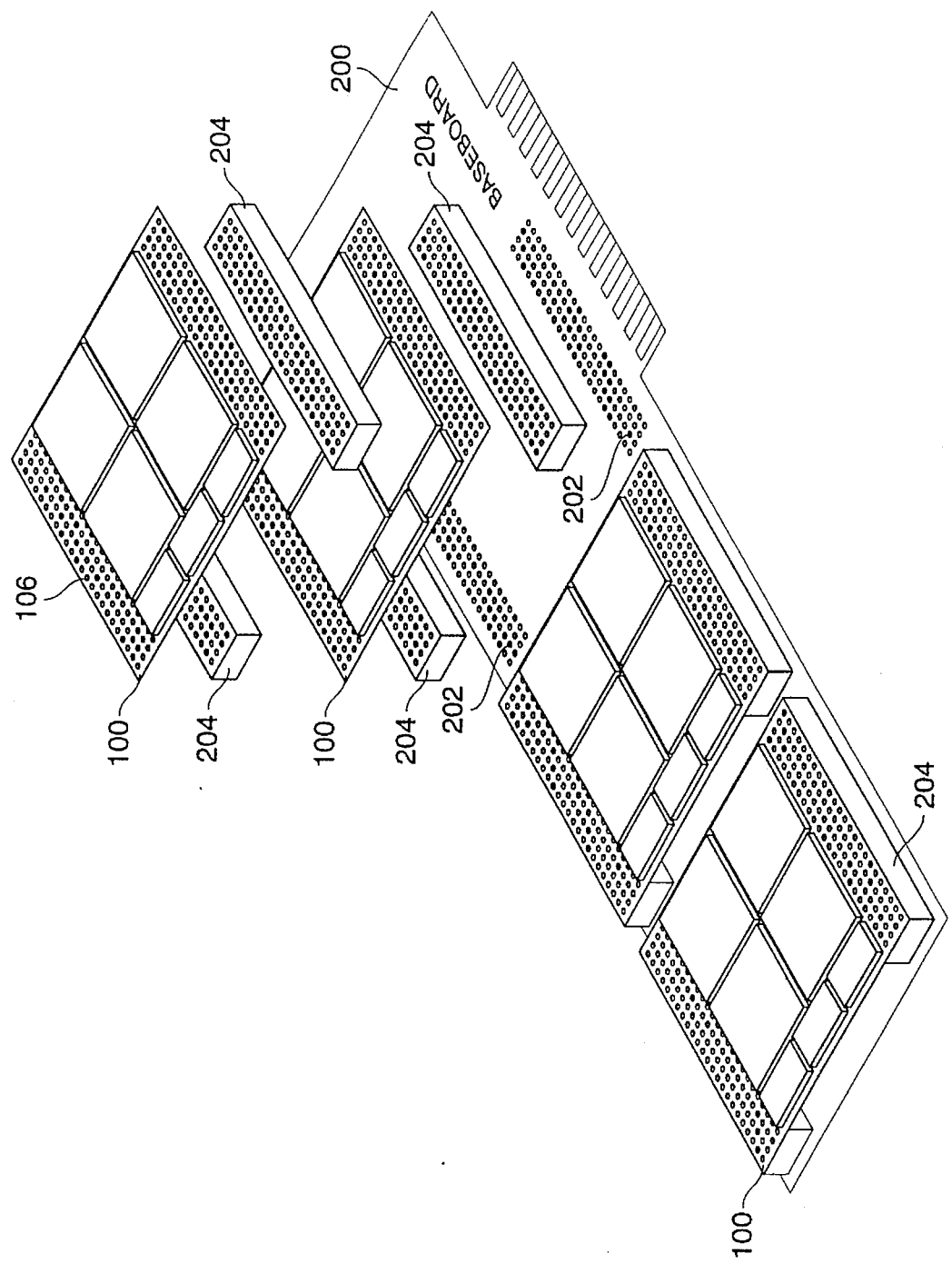
FIGS. 2A and 2B show two examples of a baseboard carrying several daughtercards in a planar and stacked fashion.

FIG. 2A illustrates one example of how a number of daughtercards 100 may be mounted on one side of a baseboard 200 in the prototyping system of the present invention. The particular example shown in FIG. 2A includes a baseboard 200 that can carry, for example, three adjacently mounted daughtercards 100 on one side. An exploded view of stacking of daughtercards 100 is also shown. Daughtercards 100 shown in FIG. 2A do not include the central array of pads and are an alternative embodiment to that shown in FIG. 1. This embodiment can accommodate larger components on its surface, while the embodiment shown in FIG. 1 provides more flexibility as it can be divided into two identical halves. Daughtercard 100 shown in FIG. 1 permits finer granularity which may be an advantage in systems that need a large number of heterogenous daughtercards on a single baseboard. Baseboard 200 of this embodiment thus includes two connector pad arrays 202 on either side along the length of the board. Special connectors 204 connect pad arrays 106 on each daughtercard 100 to pad arrays 202 on baseboard 200, or to pad arrays 106 on other daughtercards 100 when stacked.

Figure 2B:
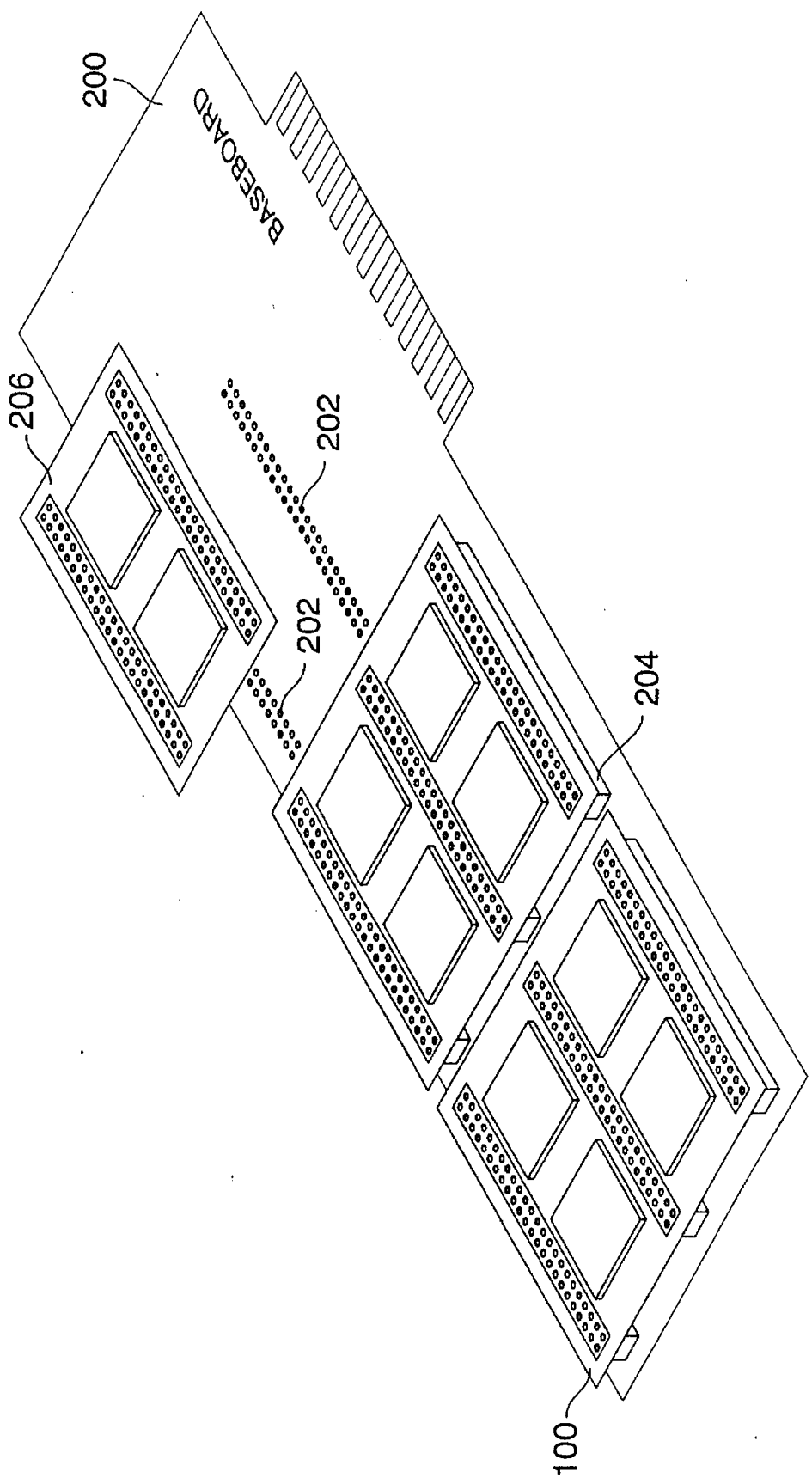

FIG. 2B shows yet another embodiment of the daughtercard/baseboard system of the present invention. In the example shown in FIG. 2B each daughtercard 100 includes three pad arrays 106, one along each edge and only one array in the center. Baseboard 200 also includes a corresponding central pad array, and in this example is shown as carrying two full-size daughtercards 100 and one half-size daughtercard 206. The option of using a half-size card allows a reduction in component and overall design cost. The daughtercards and the baseboard in this embodiment are connected by special connectors 204 as in the embodiment shown in FIG. 2A. It is to be understood that while both FIGS. 2A and 2B show mounting components on one side of baseboard 200, baseboard 200 may be double-sided allowing for a similar stacking of duaghtercards on a second side.

The type of connector 204 used for connecting to pad arrays 106 is critical to the overall performance of the system. Connector 204 should have high density and large bandwidth (high speed) with minimum crosstalk. To lower the cost, the connection made by connector 204 should preferably be solderless and require low mating force. An example of a commercially available connector that provides a good compromise is the CIN::APSE connectors from Cinch Connectors. Each CIN::APSE connector array provides 249 connectors, which results in a total of 6×249=1494 I/O terminals for each daughtercard 100 shown in FIG. 1. Typically, one third of these I/O terminals are used for power and ground connections, leaving about 1000 general purpose I/Os. About half of these general purpose I/Os (~500) connect to the baseboard or daughtercard below and half are available to connect to the daughtercard above. CIN::APSE connectors use compressible fuzz-buttons to make contact with copper pads on the baseboard and daughtercards. To hold the board and the intervening connectors together, mounting screws are used that allow easy removal of connectors if no daughtercard is present.

Figure 3:
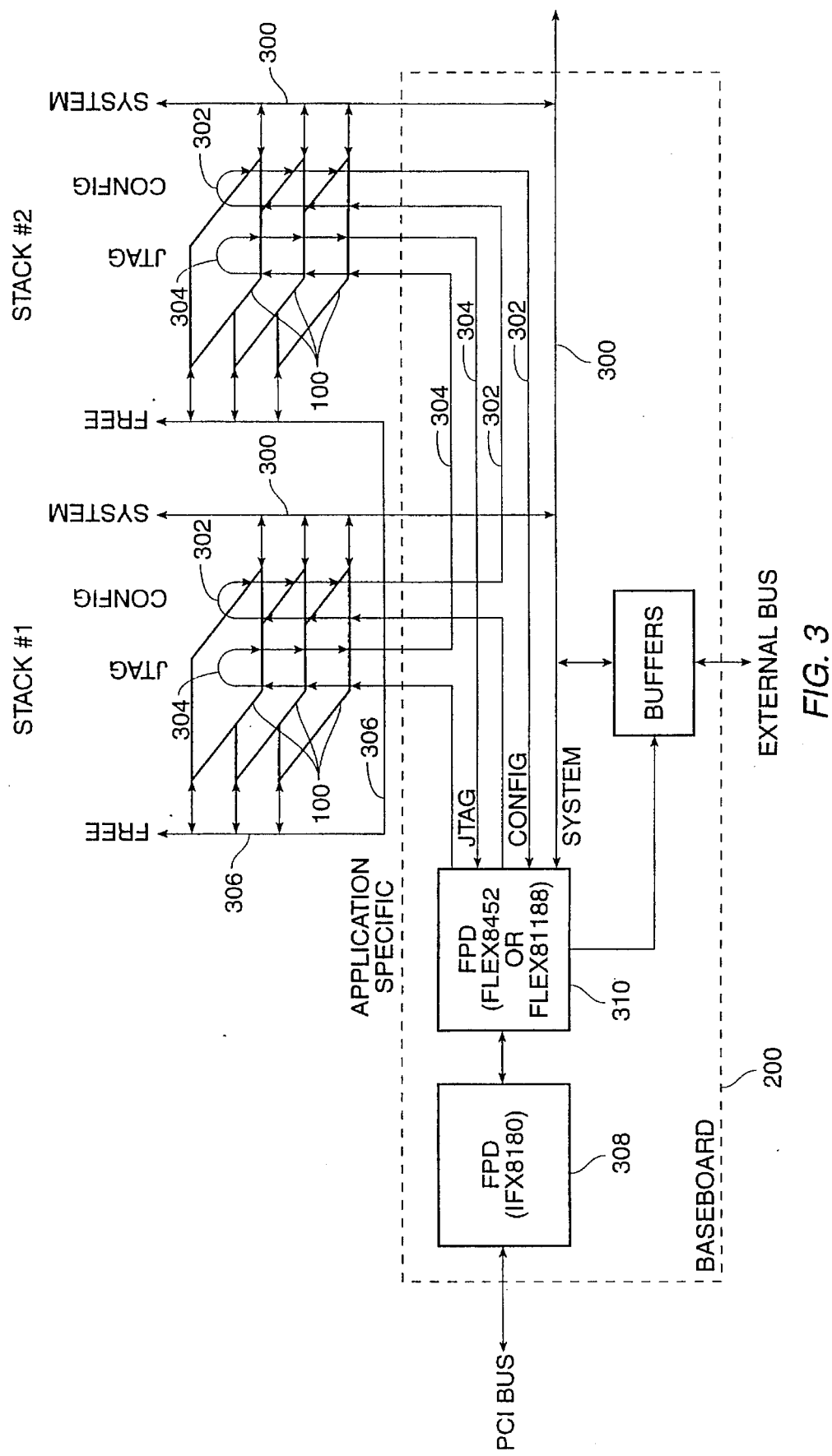
FIG. 3 shows the busing between a baseboard and daughtercards according to one embodiment of the present invention.

The total number of I/Os provided by the connectors is organized into several logical buses. FIG. 3 illustrates a high level view of how the several buses are connected in a full system. A standard system bus 300 runs in parallel to every daughtercard 100 serially and provides a standard environment for daughtercards containing microprocessors and other common peripherals. This could be a user defined bus or any one of VMEbus, SBUS, ISA, etc. A dedicated configuration bus 302 threads through each daughtercard 100 and passes configuration data from the baseboard 200 to the stacks of daughtercards. Configuration files are downloaded to each reconfigurable element depending upon their order on the configuration bus. A third bus, JTAG bus 304, operates in a similar fashion to that of configuration bus 302. JTAG bus 304 can be used, for example, to identify the members of each stack via their JTAG ID codes, force test vectors into the system, single-step the system, and gather the results for debugging. Finally, a large fourth bus is provided as a free bus 306 that provides global and local I/O between reconfigurable daughtercards. Free buses 306 in each stack are independent, but baseboard 200 or the user may add application-specific wiring if a single stack is too small for a particular function.

FIG. 3 also shows one example of the external interface circuitry for baseboard 200. An FPD 308 provides programmable interface to an external bus such as a PCI bus. An example of an FPD 308 that provides sufficient I/O to decode the 32-bit addresses passing over the PCI bus is the Altera FLEX8452 or Altera MAX7000. A second FPD 310 is also provided to control system bus 300, configuration bus 302, and JTAG bus 304 bus interfaces on baseboard 200. This chip also controls the gating of signals from system bus 300 onto the external bus of baseboard 200. With appropriate drivers, a part such as Altera's FLEX81188 can implement SCSI interface as well as provide general-purpose I/O. Various baseboards 200 can be designed to accommodate different bus standards.

The prototyping system of the present invention accommodates a large variety of daughtercards that can be mixed and matched by a user to build a particular subsystem to suit their requirement. The typical daughtercard which provides configurable logic and memory is shown in FIG. 1. FIGS.

Figure 4A:
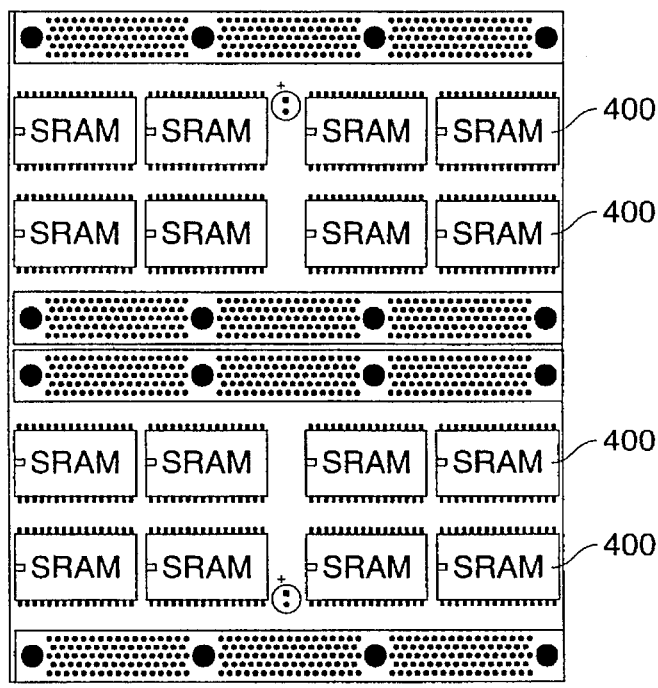
FIGS. 4A, 4B, and 4C illustrate examples of various applications for daughtercards.

4A, 4B, and 4C show several other examples of the types of daughtercards that can be built into the system of the present invention. FIG. 4A shows a dedicated double-sided memory daughtercard which includes 16 512×8 SRAM chips 400 on each side. This memory daughtercard provides 16 MByte of SRAM for memory intensive applications.

Figure 4B:
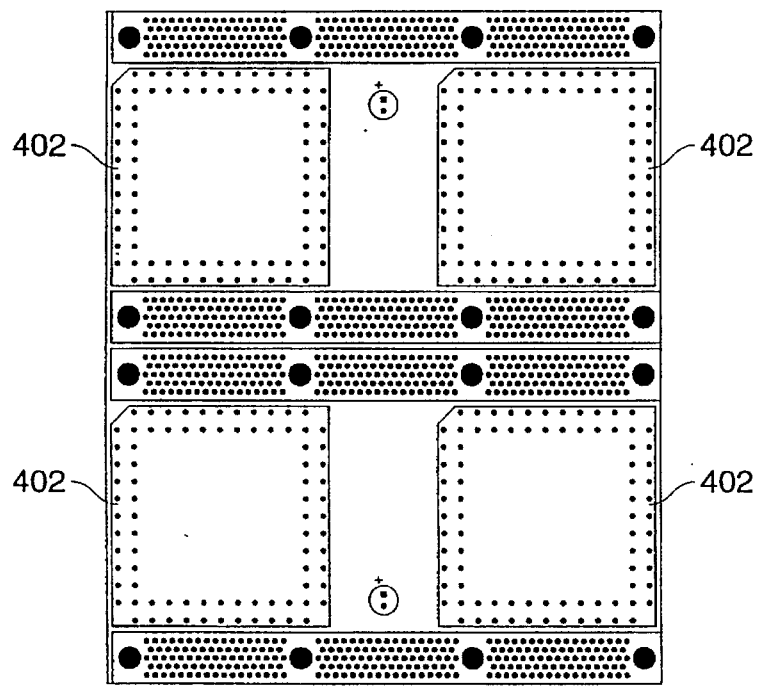

FIG. 4B shows a hobby (low-cost) daughtercard with four 84-pin PLCC sockets 402 on one side. This daughtercard could also include two sockets for memory devices, and provides a low-cost board for hobbyists who can populate the board starting with, for example, one FLEX8282 part and incrementally upgrading to larger projects. This card is different from the others in that instead of using surface mount components where the components are hard-soldered to the card, sockets are provided to facilitate easy modifications to the board. Because the socket connectors go through the card, the hobby daughtercard shown in FIG. 4B is a single-sided card. Other examples of daughtercards may provide surface mount sockets for more flexibility.

Figure 4C:
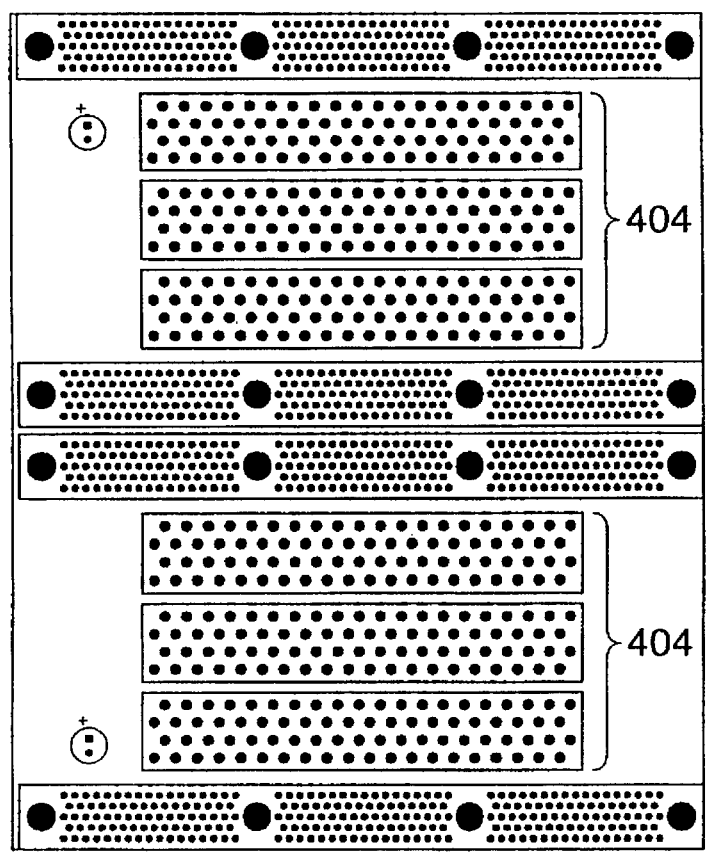

FIG. 4C shows a cable daughtercard that includes six 80-pin nanoconnectors 404 on one side. This card can bring 480 signals to an outside prototyping area through six nanocables. All the daughtercards shown in FIGS. 4A, 4B, 4C are the type that include two identical halves, with arrays of conductor pads on the edges as well as in the center of the card. A major class of applications for the system of the present invention is as a programmable application accelerator. The board can be used in a computer system, for example, to speed up image processing algorithms or for speeding compression and decompression of digital data. Other examples of application specific daughtercards include a CPU board accommodating CPU or DSP modules for incorporation into larger designs, a crossbar card including programmable interconnect layers or reconfigurable memory modules, a breadboarding card in the form of a double- or triple-wide daughtercard with large prototyping area to allow users to plug in various commercial chips to augment the logic on other daughtercards, etc.

The baseboard/daughtercard system of the present invention may incorporate a variety of daughtercard types in a single apparatus. Thus, a single system may include a mix of double-sided cards with surface mount components (e.g., memory daughtercard) and single-sided socketed cards (e.g., hobby daughtercard) as well as cards with surface mount sockets.

The total capacity of the prototyping system of the present invention is limited by factors such as size and power consumption. Assuming each CIN::APSE fuzz-button can handle 250 mA, a total current of approximately 31 A can be passed into a stack of daughtercards for the embodiment shown in FIG. 2B. This is enough current to power a stack of five daughtercards of the type used in the embodiment shown in FIG. 2B. Thus, a single baseboard 200 such as the one shown in FIG. 2B can house 10 full size daughtercards 100 and five half size daughtercards on each side, for a total capacity equal to 25 full size daughtercards for a double-sided baseboard. Given, for example, 100 k gates per daughtercard, such a board would provide a total of 2.5 million gates. An obvious problem with such a system would be a very large power consumption of about 600 W and the associated heat problems. CIN::APSE connectors, however, define a channel for forced air cooling. Other newly developed fluorinate-based heat sinks can also be utilized to address the heat problem. The baseboard may be equipped with, for example, a compatible Molex connector so that the baseboard may be powered directly by connection to a personal computer's standard power supply. In that case, the baseboard would not receive its power from the system bus.

In conclusion, the present invention provides an apparatus that includes a set of baseboards and a family of daughtercards, together with a programmable interface to an external bus for a host system. Daughtercards attach to the baseboard through complementary connectors mounted between the baseboard and the daughtercards. In addition, daughtercards are constructed to allow stacking of daughtercards vertically. The baseboard and daughtercard approach of the present invention allows simple, incremental upgrade of installed boards by adding or replacing the daughtercards and allows simple migration to new systems by changing baseboards. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A daughtercard for use in a reconfigurable baseboard/daughtercard apparatus, comprising:

a first array of electrical connectors disposed at a first edge, and on a top side of said daughtercard;

a second array of electrical connectors identical to said first array of electrical connectors disposed at a second edge opposite to said first edge, and on said top side of said daughtercard;

a third array of electrical connectors identical to said first array of electrical connectors disposed at the center and on said top side of said daughtercard;

a first plurality of connection means for housing selected electronic components; and a fourth, fifth and sixth array of electrical connectors, identical to said first array of electrical connectors and a second plurality of connection means identical to said first plurality of connection means, disposed on a bottom side of said daughtercard, mirroring said first, second and third array of electrical connectors, and said first plurality of connection means, respectively.

2. The daughtercard of claim 1 wherein selected ones of said first and second plurality of connection means house reprogrammable logic devices.

3. The daughtercard of claim 2, wherein each of said top and bottom sides further includes a bus for directly coupling each reprogrammable logic device to its two adjacent ones and the one reprogrammable logic device disposed directly under it.

4. The daughtercard of claim 3 wherein selected ones of said first and second plurality of connection means house memory devices, said memory devices coupled to an adjacent reprogrammable logic device.

5. The daughtercard of claim 1 wherein all connection means of each one of said top and bottom sides house memory devices.

6. The daughtercard of claim 1 wherein in place of said connection means on said top side, said daughtercard includes at least one fast external connector.

7. The daughtercard of claim 1 wherein a dual daughtercard is made by abutting two of said daughtercards.

8. The daughtercard of claim 1 wherein a connector means couples said first and second array of electrical connectors to a corresponding first and second array of electrical connectors of a second daughtercard for stacking of two daughtercards.

9. A reconfigurable apparatus for computing systems comprising:

a baseboard having a first array of electrical connectors disposed along a first edge and a second array of identical electrical connectors disposed along a second edge opposite to said first edge, and an external interface having a third array of connectors for coupling said baseboard to an external system; and a plurality of daughtercards each having a first and second array of electrical connectors connectable to said first and second array of electrical connectors of said baseboard and connectable to a first and second array of electrical connectors of another one of said plurality of daughtercards, each one of said plurality of daughtercards further having a plurality of connection means adapted to receive electronic components and an internal bus network coupling said plurality of connection means to said array of electrical connectors, wherein said first and second array of electrical connectors of said baseboard, and said first and second array of electrical connectors as well as said internal bus network of said plurality of daughtercards are configured to provide a system bus network including a first global bus coupling said plurality of daughtercards in a parallel fashion, and a second global bus coupling said plurality of daughtercards in a serial fashion, and wherein, a computing subsystem can be implemented by mounting selected electronic components on said plurality of connection means on said plurality of daughtercards, and electrically coupling a selected number of said plurality of daughtercards in a planar and stacked fashion on said baseboard.

10. The reconfigurable apparatus of claim 9 further comprising connector means for coupling said first and second array of electrical connectors of each of said plurality of daughtercards to said first and second array of electrical connectors of said baseboard, respectively, and to said first and second array of electrical connectors of another one of said plurality of daughtercards, respectively.

11. The reconfigurable apparatus of claim 10 wherein said first global bus also couples to said third array of connectors of said external interface on said baseboard.

12. The reconfigurable apparatus of claim 11 wherein selected connection means of at least one of said plurality of daughtercards carries reprogrammable logic devices.

13. The reconfigurable apparatus of claim 12 wherein said at least one of said plurality of daughtercards further comprises a memory device coupled to said reprogrammable logic devices.

14. The reconfigurable apparatus of claim 12 wherein said second global bus is a configuration bus serially coupling attached daughtercards for providing configuration data to said reprogrammable logic devices.

15. The reconfigurable apparatus of claim 9 wherein said system bus network further comprises an intercard bus providing global and local input/output coupling between said plurality of daughtercards.

16. The reconfigurable apparatus of claim 9 wherein selected ones of said plurality of connection means on said plurality of daughtercards are of the type that can receive surface mountable electronic components.

17. The reconfigurable apparatus of claim 9 wherein selected ones of said plurality of connections means on said plurality of daughtercards are in the form of sockets.

18. The reconfigurable apparatus of claim 9 wherein selected ones of said plurality of connection means on said plurality of daughtercards are in the form of sockets, and selected other ones of said plurality connection means on said plurality of daughtercards are of the type that can receive surface mountable electronic components.

19. The reconfigurable apparatus of claim 9 wherein each one of said plurality of daughtercards is double-sided with a bottom side including a third and fourth array of electrical connectors and a second plurality of connection means mirroring a top side.

20. The reconfigurable apparatus of claim 19 wherein one of said plurality of daughtercards comprises:

a first plurality of reprogrammable logic devices and memory devices mounted onto said plurality of connection means on said top side;

a second plurality of reprogrammable logic devices and memory devices mounted onto said plurality of connection means on said bottom side, mirroring said top side, wherein said internal bus network interconnects said first and second plurality of reprogrammable logic devices and memory devices.

21. The reconfigurable apparatus of claim 20 wherein said internal bus network provides a nearest-neighbor cube direct coupling among said first and second plurality of reprogrammable logic devices.

22. A reconfigurable apparatus for computing systems comprising:

a plurality of daughtercards, each one including on a top side and a bottom side a first array of electrical connectors along a first edge and an identical second array of electrical connectors along a second edge, a plurality of electronic components mounted on said top side and said bottom side, and an internal bus network coupling said first and second array of electrical connectors to said plurality of electronic components, wherein at least one of said plurality of daughtercards comprises a plurality of reprogrammable logic devices as said electronic components;

a baseboard having first and second arrays of electrical connectors on a top surface and along first and second edges, complementary to said first and second array of electrical connectors of said plurality of daughtercards, and a third array of electrical connector adapted for interfacing with an external system; and connector means for connecting said first and second arrays of electrical connectors on said plurality of daughtercards to said first and second arrays of electrical connectors on said baseboard, and to first and second arrays of electrical connectors of another daughtercard, wherein, said first and second array of electrical connectors on said plurality of daughtercards and said baseboard, and said internal bus network are configured to provide a system bus network including a first global bus coupling said plurality of daughtercards in a parallel fashion, and a second global bus coupling said plurality of daughtercards in a serial fashion, and wherein said second global bus supplies configuration data through said plurality of reprogrammable logic devices serially.

23. The reconfigurable apparatus of claim 22 wherein said baseboard further includes third and fourth arrays of electrical connectors on a bottom surface mirroring said first and second arrays of electrical connectors.

24. An electrically reconfigurable circuit apparatus comprising:

a baseboard comprising:

a first array of electrical connectors disposed along a first edge, an identical second array of electrical connectors disposed along a second edge opposite to said first edge, an external interface having a third array of electrical connectors configured to couple said baseboard to an external system, and an internal baseboard interconnect network coupling said third array of electrical connectors to said first and second array electrical connectors; and a plurality of daughtercards each having a first and second array of electrical connectors adapted to be directly mounted on said first and second array of electrical connectors of said baseboard via connector means, and directly mounted on said first and second array of electrical connectors of another one of said plurality of daughtercards via connector means, selected ones of said plurality of daughtercards further comprising a plurality of reprogrammable logic devices mounted thereon, and an internal daughtercard interconnect network respectively coupling said plurality of reprogrammable logic devices to said first and second array of electrical connectors on each daughtercard, said selected ones of said plurality of daughtercards being mounted on said baseboard in planar and stacked fashion, wherein said internal baseboard interconnects, said internal daughtercard interconnects and said first and second electrical connectors of said baseboard and said selected ones of said plurality of daughtercards are configured to provide a bus network including:

a system bus coupling to all daughtercards mounted on said baseboard in a parallel fashion, and a configuration bus coupling said external interface to all daughtercards in a serial fashion, said configuration bus supplying configuration data to said plurality of reprogrammable logic devices mounted on said daughtercards.

25. The electrically reconfigurable circuit apparatus of claim 24 wherein said baseboard further comprises interface circuitry mounted thereon and coupled to said external interface, said interface circuitry including a reprogrammable logic device dedicated to interface function and input/output buffering devices.

* * * * *